(12) United States Patent
Chen et al.

(10) Patent No.: US 10,483,167 B2
(45) Date of Patent: Nov. 19, 2019

(54) METHOD FOR MANUFACTURING DUAL FINFET DEVICE

(71) Applicant: TAIWAN SEMICONDUCTOR MANUFACTURING CO., LTD., Hsinchu (TW)

(72) Inventors: Wei-Barn Chen, Tainan (TW); Ting-Huang Kuo, Tainan (TW); Shiu-Ko Jangjian, Tainan (TW); Chi-Cherng Jeng, Tainan (TW); Kuang-Yao Lo, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/678,097

(22) Filed: Aug. 15, 2017

(65) Prior Publication Data
US 2019/0057905 A1  Feb. 21, 2019

(51) Int. Cl.
*H01L 21/8234* (2006.01)
*H01L 29/66* (2006.01)
*H01L 21/308* (2006.01)
*H01L 21/265* (2006.01)
*H01L 27/088* (2006.01)

(52) U.S. Cl.
CPC ........... *H01L 21/823412* (2013.01); *H01L 21/26513* (2013.01); *H01L 21/3085* (2013.01); *H01L 21/3086* (2013.01); *H01L 21/823431* (2013.01); *H01L 21/823481* (2013.01); *H01L 27/0886* (2013.01); *H01L 29/66545* (2013.01); *H01L 21/823418* (2013.01); *H01L 21/823468* (2013.01)

(58) Field of Classification Search
None
See application file for complete search history.

(56) References Cited

U.S. PATENT DOCUMENTS

| | | | |
|---|---|---|---|
| 7,126,199 B2* | 10/2006 | Doczy | H01L 21/823437 257/412 |
| 9,608,114 B2* | 3/2017 | Kim | H01L 29/7849 |
| 9,613,960 B2* | 4/2017 | Li | H01L 27/0924 |
| 9,691,766 B1* | 6/2017 | Lin | H01L 27/0886 |
| 2006/0081895 A1 | 4/2006 | Lee et al. | |
| 2008/0029821 A1* | 2/2008 | Yamagami | H01L 21/823807 257/365 |
| 2009/0023261 A1 | 1/2009 | Hirano | |

(Continued)

*Primary Examiner* — Andres Munoz
(74) *Attorney, Agent, or Firm* — Maschoff Brennan

(57) ABSTRACT

In a method for manufacturing a semiconductor device, a substrate is provided. A hard mask and a mask layer are formed on a first region and a second region of the substrate. The substrate is recessed using the hard mask and the mask layer to form a fin structure in the first region and a raised structure in the second region. First isolation structures and second isolation structures are formed on lower portions of opposite sidewalls of the fin structure and opposite sidewalls of the raised structure. A first gate structure is formed on a portion of the fin structure, and a second gate structure is formed on a portion of the raised structure. A first source and a first drain are formed on opposite sides of the first gate structure, and a second source and a second drain are formed on opposite sides of the second gate structure.

20 Claims, 12 Drawing Sheets

(56) References Cited

U.S. PATENT DOCUMENTS

| | | | |
|---|---|---|---|
| 2009/0294874 A1* | 12/2009 | Lee | H01L 21/823412 257/401 |
| 2015/0214370 A1* | 7/2015 | Kim | H01L 29/0847 257/401 |
| 2015/0364593 A1* | 12/2015 | Jangjian | H01L 29/785 257/401 |
| 2016/0268434 A1 | 9/2016 | Ching et al. | |
| 2017/0236841 A1* | 8/2017 | Song | H01L 27/1211 257/192 |

* cited by examiner

METHOD FOR MANUFACTURING DUAL FINFET DEVICE

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, conventional FinFET devices and methods of fabricating the FinFET devices have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
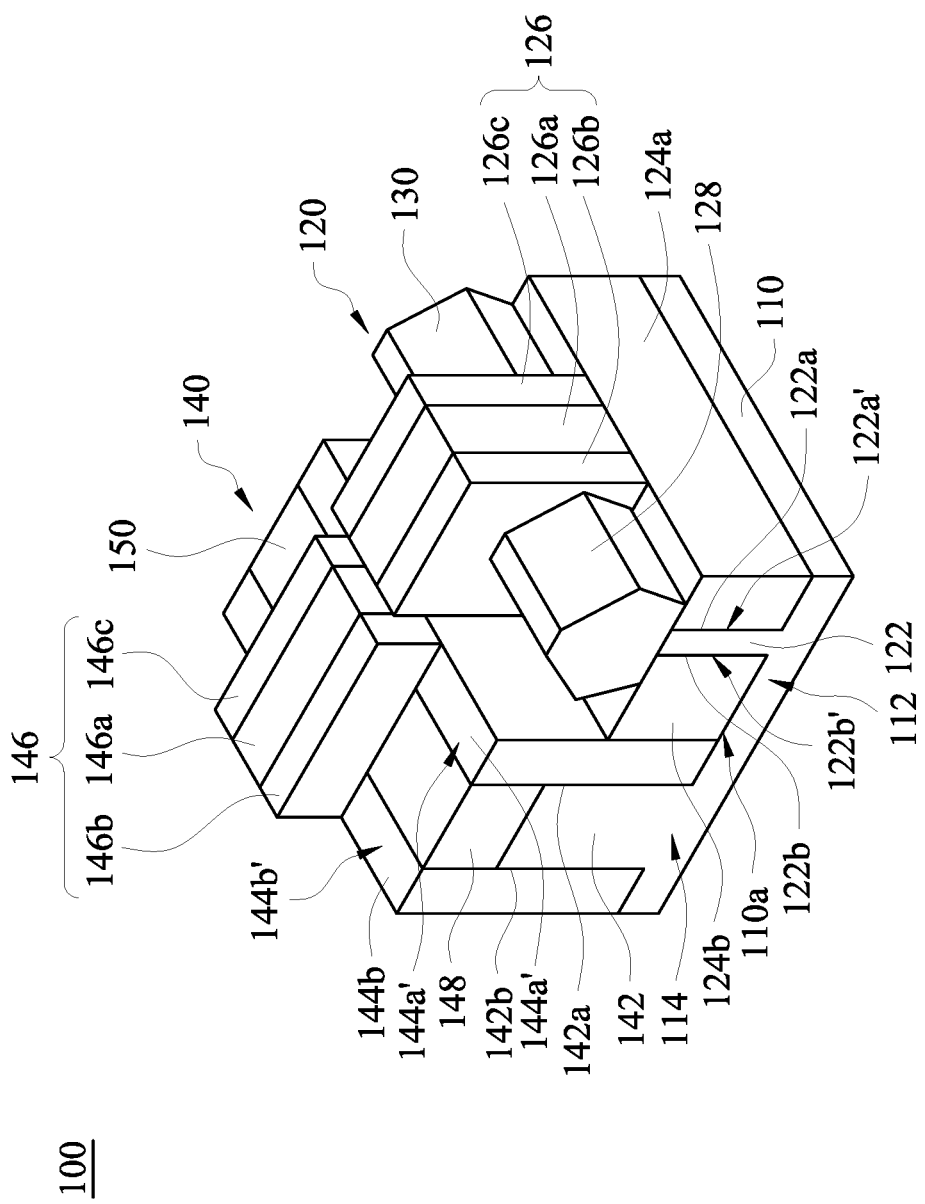
FIG. 1 is schematic perspective drawing of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

A FinFET device is a three-dimensional structure, and a planar metal oxide semiconductor field effect transistor (MOSFET) device is a two-dimensional structure, such that the parasitic capacitance of the FinFET device is greater than the parasitic capacitance of the planar MOSFET device. Therefore, a cut-off frequency (Ft) of the FinFET device is much lower than a cut-off frequency of the planar MOSFET. Typically, the FinFET device and the planar MOSFET device are separately manufactured on two wafers, and the FinFET device and the planar MOSFET device are two individual devices. Therefore, the process of manufacturing an electronic product including both the FinFET device and the planar MOSFET device is complex, and it is unfavorable to the microminiaturizing of the electronic product.

Embodiments of the present disclosure are directed to providing a method for manufacturing a semiconductor device, in which an additional mask layer is used to define multiple MOSFET structures, such that a FinFET structure and a planar FET structure are simultaneously formed on the same substrate. Therefore, the process of manufacturing a semiconductor device including both the FinFET structure and the planar FET structure is simplified, and the semiconductor device is microminiaturized.

FIG. 1 is schematic perspective drawing of a semiconductor device in accordance with various embodiments. In some embodiments, a semiconductor device 100 is dual MOSFET structure device. The semiconductor device 100 may include a substrate 110, a FinFET structure 120, and a planar FET structure 140. The substrate 110 includes a first region 112 and a second region 114. In some examples, the first region 112 is adjacent to the second region 114. The substrate 110 may be composed of a single-crystalline semiconductor material or a compound semiconductor material. For example, silicon, germanium or glass may be used as a material of the substrate 110. In some exemplary examples, the substrate 110 is composed of silicon.

The FinFET structure 120 is disposed in the first region 112 of the substrate 110. In some examples, the FinFET structure 120 includes at least one fin structure 122, at least two first isolation structures 124a and 124b, a first gate structure 126, a first source 128, and a first drain 130. The fin structure 122 is disposed on the substrate 110. In some examples, the fin structure 122 is formed by recessing the substrate 110, and thus the fin structure 122 protrudes from a recessed surface 110a of the substrate 110, in which the fin structure 122 and the substrate 110 are formed from the same material.

As shown in FIG. 1, the first isolation structures 124a and 124b are respectively disposed on two opposite sidewalls 122a and 122b of the fin structure 122 and extend along a direction that the fin structure 122 extends along. The first isolation structures 124a and 124b respectively cover a lower portion 122a' of the sidewall 122a and a lower portion 122b' of the sidewall 122b. In some exemplary examples, the first isolation structures 124a and 124b are formed from silicon oxide.

The first gate structure 126 extends on a portion of the fin structure 122 and portions of the first isolation structures 124a and 124b. An extending direction of the first gate structure 126 is different from the extending direction of the fin structure 122. For example, the extending direction of the first gate structure 126 may be perpendicular to that of the fin structure 122. The first gate structure 126 covers upper portions of the sidewalls 122a and 122b and a top surface of the portion of the fin structure 122, in which the upper portions of the sidewalls 122a and 122b are respectively located over the lower portion 122a' of the sidewall 122a and the lower portion 122b' of the sidewall 122b, and the top surface of the fin structure 122 are connected to the sidewalls 122a and 122b. In some examples, the first gate structure 126 includes a first gate 126a and two first spacers 126b and 126c. The first spacers 126b and 126c are disposed on the fin structure 122 and the first isolation structures 124a and 124b, and are separated from each other. The first gate 126a is disposed between the first spacers 126b and 126c and covers the upper portions of the sidewalls 122a and 122b and the top surface of the portion of the fin structure 122. In some exemplary examples, the first spacers 126b and 126c are formed from silicon nitride or silicon oxynitride, and the first gate 126a includes a metal layer.

The first source 128 and the first drain 130 are respectively disposed on two opposite sides of the first gate structure 126 and are located on the fin structure 122. The first source 128 and the first drain 130 respectively pass through the first spacers 126b and 126c. In some exemplary examples, each of the first source 128 and the first drain 130 is an epitaxy structure. For example, the first source 128 and the first drain 130 are formed from epitaxial SiGe.

Referring to FIG. 1 again, the planar FET structure 140 is disposed in the second region 114 of the substrate 110. In some examples, the planar FET structure 140 includes a raised structure 142, two second isolation structures 144a and 144b, a second gate structure 146, a second source 148, and a second drain 150. The raised structure 142 is disposed on the substrate 110. In some examples, the raised structure 142 is formed by recessing the substrate 110, such that the raised structure 142 protrudes from a recessed surface 110a of the substrate 110, and thus the raised structure 142 and the substrate 110 are formed from the same material.

The second isolation structures 144a and 144b are respectively disposed on two opposite sidewalls 142a and 142b of the raised structure 142 and extend a direction that the raised structure 142 extends. The second isolation structures 144a and 144b completely cover the sidewalls 142a and 142b. In some examples, the first isolation structures 144a and 144b are formed from silicon oxide. In some exemplary examples, a top surface of the raised structure 142, which is covered by the second gate structure 146, is substantially aligned with a top surface 144a' of the second isolation structure 144a and a top surface 144b' of the second isolation structure 144b.

The second gate structure 146 extends on a portion of the raised structure 142 and portions of the second isolation structures 144a and 144b. An extending direction of the second gate structure 146 is different from the extending direction of the raised structure 142. For example, the extending direction of the second gate structure 146 may be perpendicular to that of the raised structure 142. The second gate structure 146 covers a top surface of the portion of the raised structure 142, in which the top surface of the raised structure 142 are connected to the sidewalls 142a and 142b. In some examples, the second gate structure 146 includes a second gate 146a and two second spacers 146b and 146c. The second spacers 146b and 146c are disposed on the raised structure 142 and the second isolation structures 144a and 144b, in which the second spacers 146b and 146c are separated from each other. The second gate 146a is disposed between the second spacers 146b and 146c and covers the top surface of the portion of the raised structure 142. In some exemplary examples, the second spacers 146b and 146c are formed from silicon nitride or silicon oxynitride, and the second gate 146a includes a metal layer.

The second source 148 and the second drain 150 are respectively disposed on two opposite sides of the second gate structure 146 and are located in the raised structure 142. A portion of the second source 148 and a portion of the second drain 150 are respectively disposed under the second spacers 146b and 146c. In some exemplary examples, each of the second source 148 and the second drain 150 is an epitaxy structure. For example, the second source 148 and the second drain 150 are formed from epitaxial SiGe.

The FinFET structure 120 and the planar FET structure 140 are formed on the same substrate 110, such that the semiconductor device 100 is microminiaturized, thereby increasing the application of the semiconductor device 100.

Figure 2A:
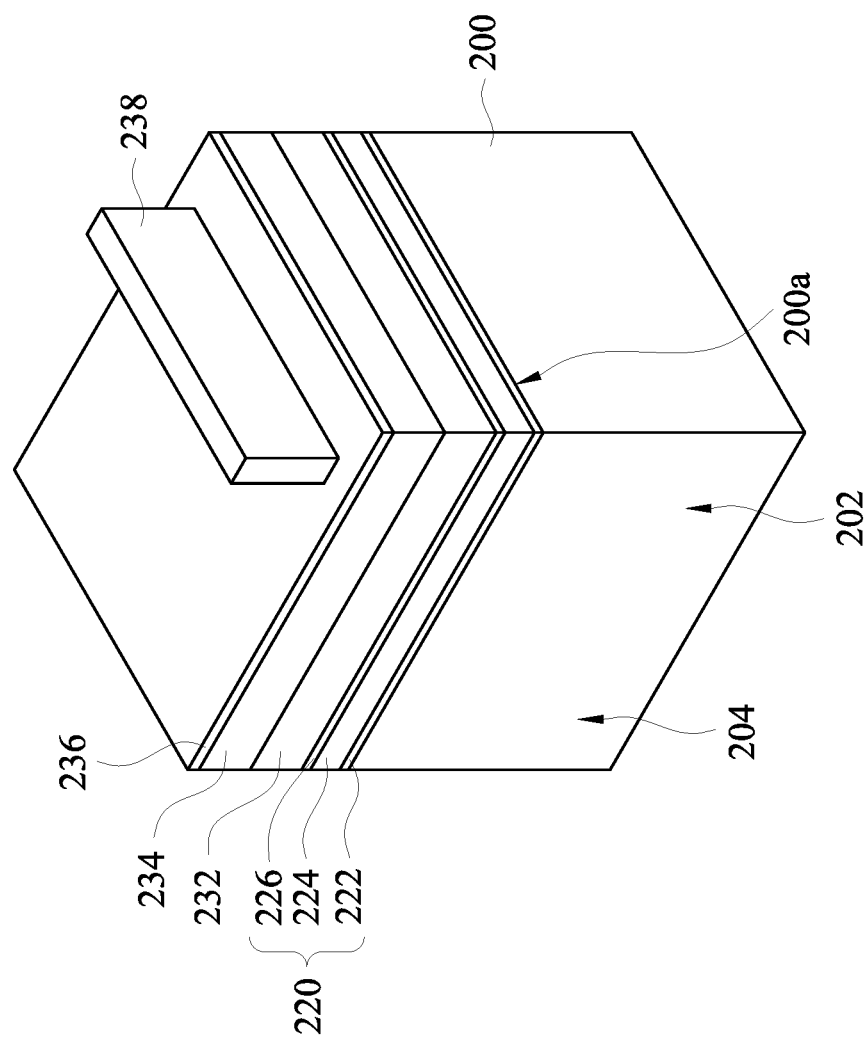
FIG. 2A through FIG. 2J are schematic views of intermediate stages showing a method for manufacturing a semiconductor device in accordance with various embodiments.

FIG. 2A through FIG. 2J are schematic views of intermediate stages showing a method for manufacturing a semiconductor device in accordance with various embodiments. As shown in FIG. 2A, a substrate 200 is provided. The substrate 200 includes a first region 202 and a second region 204. In some examples, the first region 202 is adjacent to the second region 204. The substrate 200 may be composed of a single-crystalline semiconductor material or a compound semiconductor material. For example, silicon, germanium or glass may be used as a material of the substrate 200.

Figure 2B:
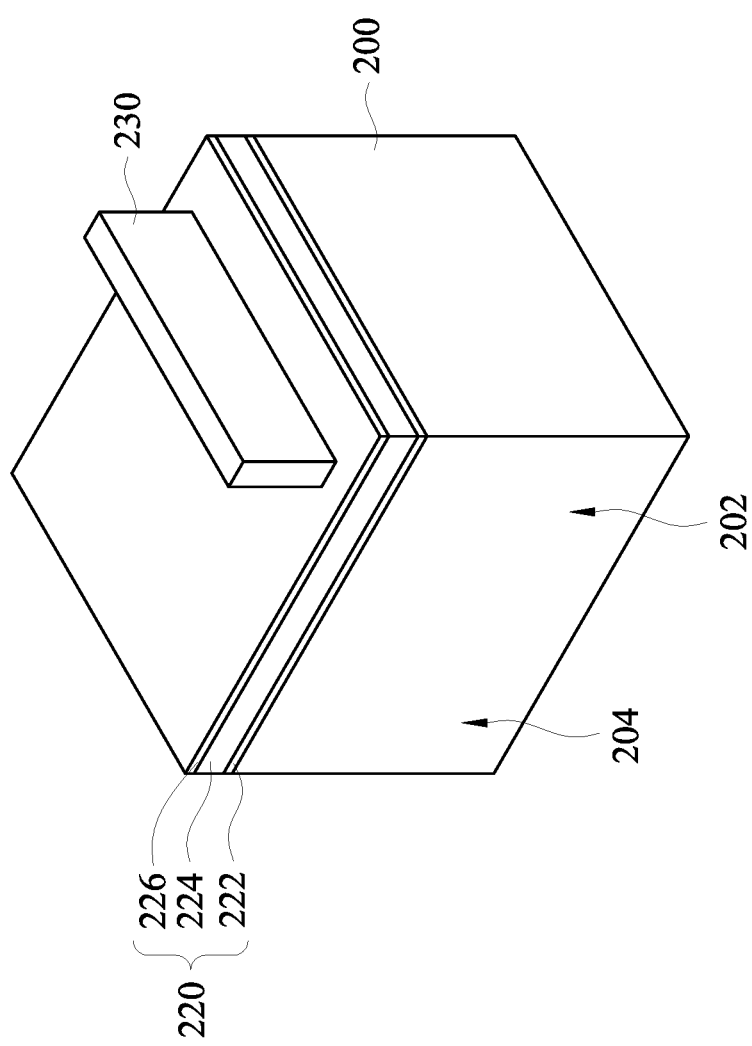
Figure 2C:
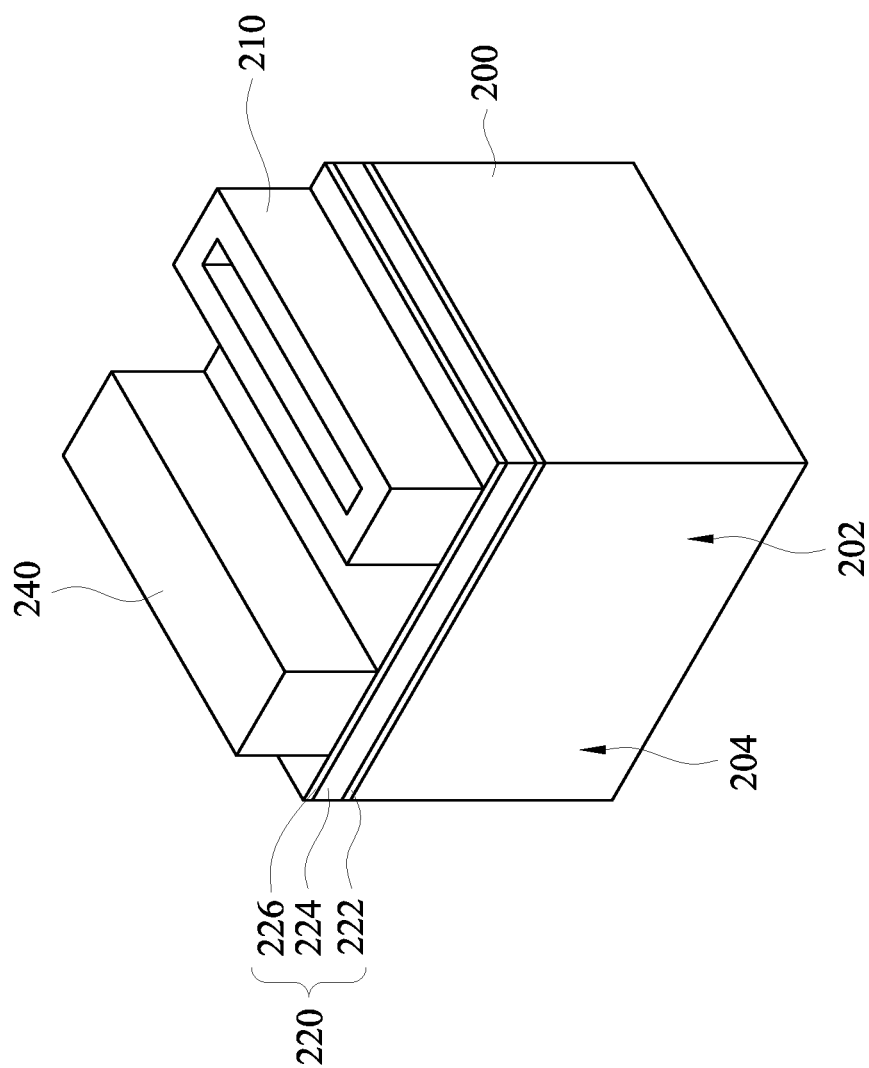

As shown in FIG. 2C, at least one hard mask 210 is formed on the first region 202 of the substrate 200. In some examples, in forming of the hard mask 210, a hard mask structure 220 is formed on a surface 200a of the substrate 200. The hard mask structure 220 may be formed to include various layers. For example, as shown in FIG. 2A, forming the hard mask structure 220 may include forming a pad oxide layer 222 on the surface 200a of the substrate 200, forming a hard mask layer 224 on the pad oxide layer 222, and forming an oxide layer 226 on the hard mask layer 224. In some exemplary examples, the pad oxide layer 222 is formed from silicon oxide, the mask layer 224 is formed from silicon nitride, and the oxide layer 226 is formed from silicon oxide.

In some examples, as shown in FIG. 2B, in forming of the hard mask 210, after the hard mask structure 220 is completed, after the hard mask structure 220 is completed, at least one fin mandrel 230 is formed on the hard mask structure 220 on the first region 202 of the substrate 200. In some exemplary examples, as shown in FIG. 2A, in forming the fin mandrel 230, a fin mandrel layer 232 is formed on the hard mask structure 220, an anti-reflective film 234 is formed on the fin mandrel layer 232, a protective layer 236 is formed on the anti-reflective film 234, and then an etching mask 238 is formed on a portion of the protective layer 236. Then, an etching operation is performed on the protective layer 236, the anti-reflective film 234, and the fin mandrel layer 232 by using the etching mask 238 to block an etchant, such that a portion of the protective layer 236, a portion of the anti-reflective film 234, and a portion of the fin mandrel layer 232 are removed. After the etching operation is completed, the remaining protective layer 236 and the remaining anti-reflective film 234 are removed, and the remaining fin mandrel layer 232 is left to form the fin mandrel 230. The fin mandrel layer 232 has an etch selectivity related to the hard mask 210. For example, the hard mask 210 may be formed from silicon nitride, and the fin mandrel layer 232 may be formed from polysilicon. The protective layer 236 may be formed from oxynitride, and the etching mask 238 may be formed from photo-resist.

After the forming of the fin mandrel 230 is completed, the hard mask 210 is formed to peripherally enclose the fin mandrel 230. In some exemplary examples, as shown in FIG. 2B and FIG. 2C, the fin mandrel 230 is a bar structure, and the hard mask 210 is a rectangular frame structure. Then, the fin mandrel 230 is removed by an etching process, such as a dry etching process, so as to leave the hard mask 210 on the first region 202 of the substrate 200, as shown in FIG. 2C.

Referring to FIG. 2C again, a mask layer 240 is formed on the hard mask structure 220 on the second region 204 of the substrate 200. In some exemplary examples, the mask layer 240 is formed from photo-resist.

Figure 2D:
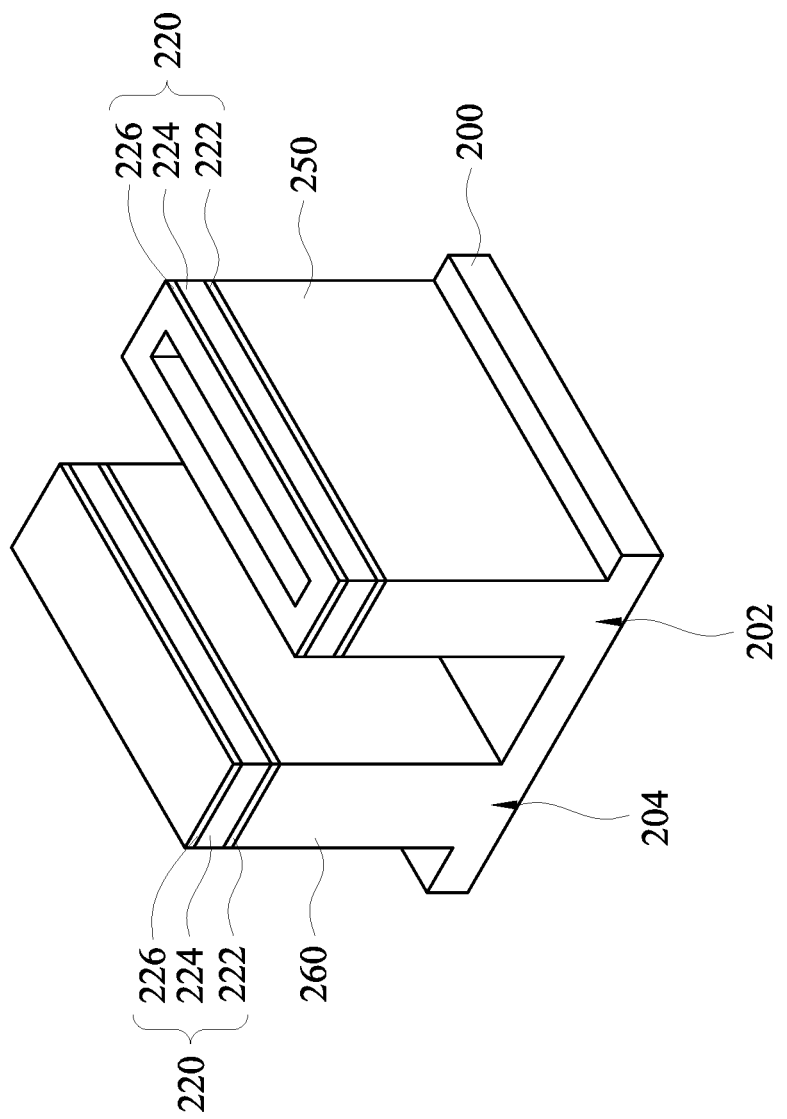

As shown in FIG. 2D, the substrate 200 is recessed by using the hard mask 210 and the mask layer 240 to form a first raised structure 250 in the first region 202 and a second raised structure 260 in the second region 204. In some examples, the substrate 200 is recessed by performing an etching process with the hard mask 210 and the mask layer 240 as etching mask structures, in which the etching process is performed to remove portions of the hard mask structure 220 and portions of the substrate 200, which are not covered by the hard mask 210 and the mask layer 240. The etching process may be a dry etching process or a wet etching process. After the substrate 200 is recessed, the remaining hard mask 210 and the remaining mask layer 240 are removed.

Figure 2E:
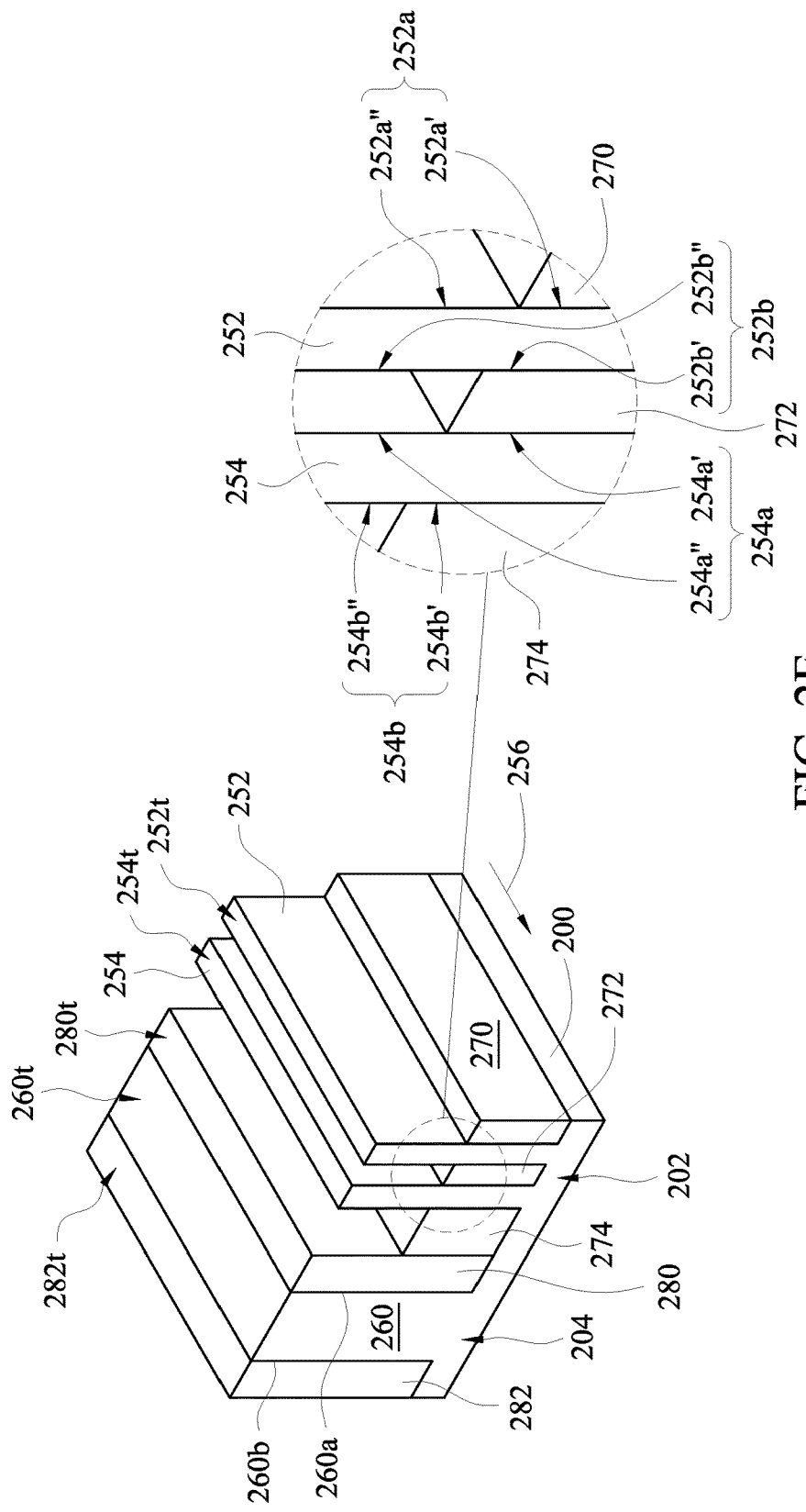

In some examples, at least two first isolation structures and two second isolation structures are formed. For example, as shown in FIG. 2E, three first isolation structures 270, 272, and 274, and two second isolation structures 280 and 282 are formed. In forming the first isolation structures, portions of the first raised structure 250 and portions of the hard mask structure 220 on the portions of the first raised structure 250 are removed to define the first raised structure 250 into at least two fin structures 252 and 254, in which the fin structures 252 and 254 extend along a direction 256. In some exemplary examples, the first isolation structures 270, 272, and 274 extend along the direction 256 that the fin structures 252 and 254 extends along. In addition, lower portions 252a' and 252b' of two opposite sidewalls 252a and 252b of the fin structure 252 are covered by the first isolation structures 270 and 272, and lower portions 254a' and 254b' of two opposite sidewalls 254a and 254b of the fin structure 254 are covered by the first isolation structures 272 and 274. A top surface 252t and upper portions 252a" and 252b" of the sidewalls 252a and 252b of the fin structure 252, and a top surface 254t and upper portions 254a" and 254b" of the sidewalls 254a and 254b of the fin structure 254 are exposed.

In some exemplary examples, the second isolation structures 280 and 282 extend along the direction 256. Two opposite sidewalls 260a and 260b of the second raised structure 260 are completely covered by the second isolation structures 280 and 282 respectively. In some exemplary examples, a top surface 260t of the second raised structure 260 is substantially aligned with a top surface 280t of the second isolation structure 280 and a top surface 282t of the second isolation structure 282. For example, the first isolation structures 270, 272, and 274, and the second isolation structures 280 and 282 are formed from silicon oxide.

Figure 2F:
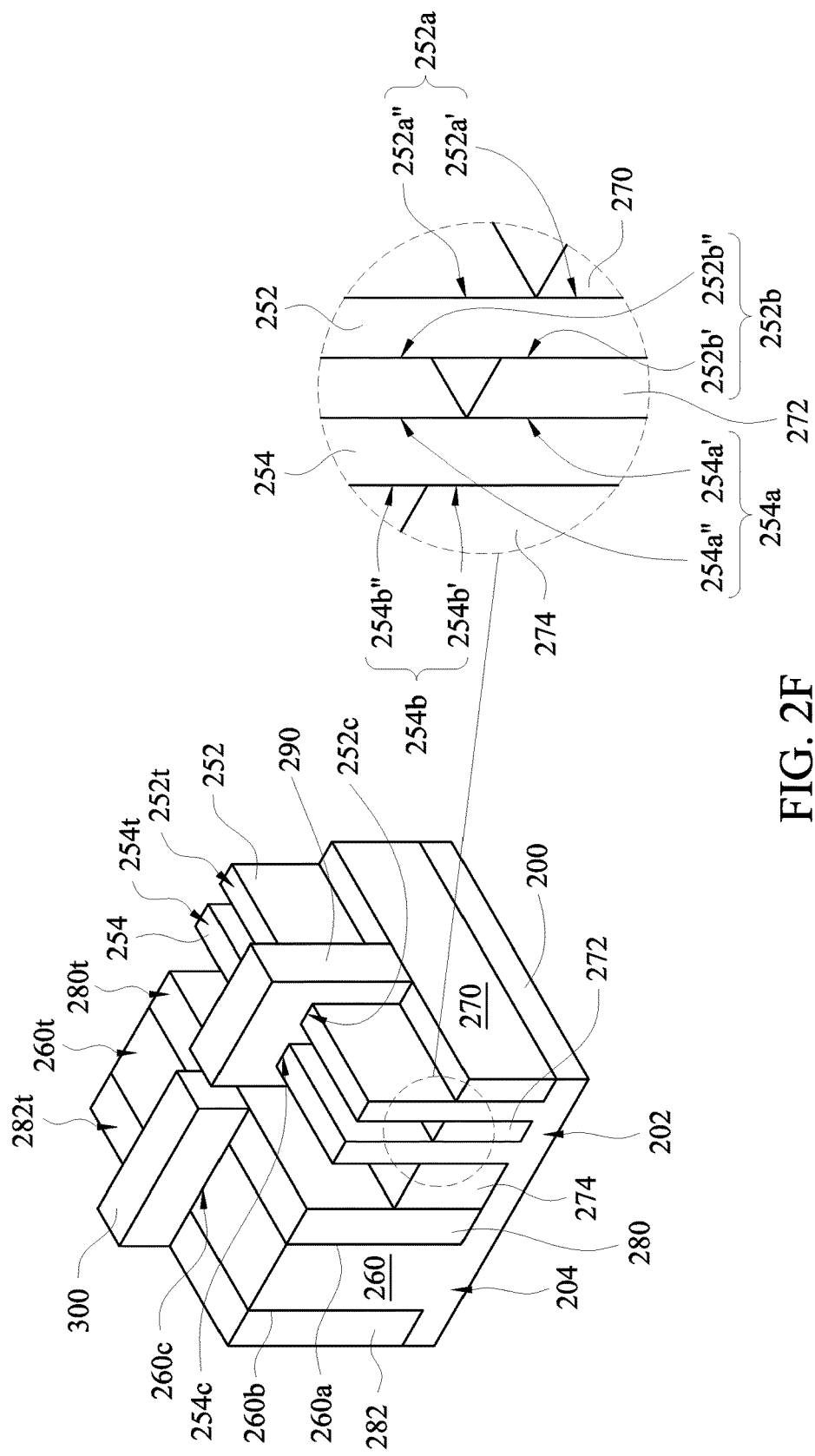

As shown in FIG. 2F, a first dummy gate 290 is formed to extend on a first portion 252c of the fin structure 252, a first portion 254c of the fin structure 254, and portions of the first isolation structure 270, the first isolation structure 272, and the first isolation structure 274. An extending direction of the first dummy gate 290 is different from the extending direction 256 of the fin structures 252 and 254. For example, the extending direction of the first dummy gate 290 may be perpendicular to the direction 256 of the fin structures 252 and 254. The first dummy gate 290 covers the top surface 252t and the upper portions 252a" and 252b" of the sidewalls 252a and 252b of the first portion 252c of the fin structure 252, and the top surface 254t and the upper portions 254a" and 254b" of the sidewalls 254a and 254b of the first portion 254c of the fin structure 254. Referring to FIG. 2F again, a second dummy gate 300 is formed to extend on a first portion 260c of the second raised structure 260, and portions of the second isolation structure 280 and the second isolation structure 282. In some exemplary examples, the first dummy gate 290 and the second dummy gate 300 are formed from polysilicon.

Figure 2G:
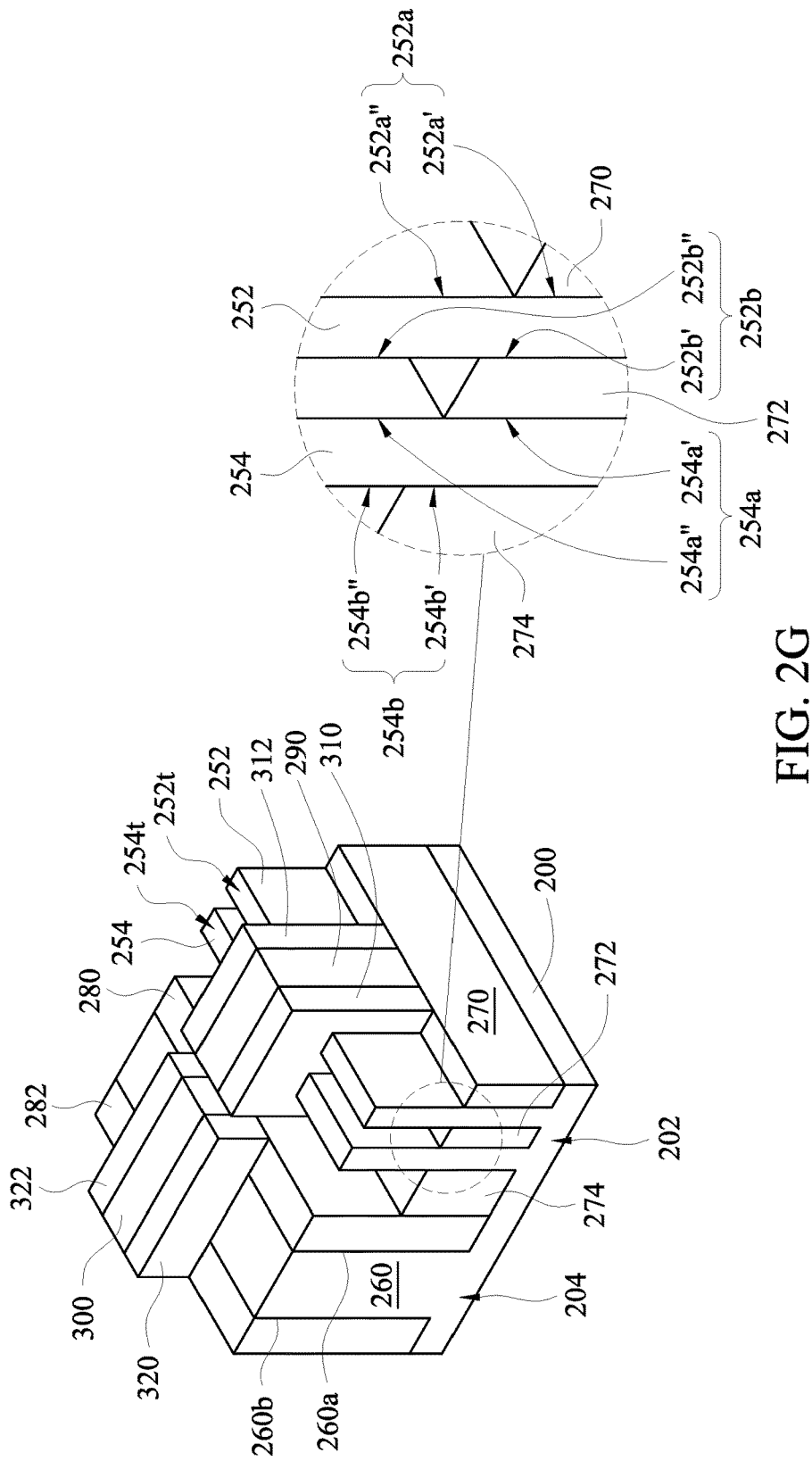

As shown in FIG. 2G, two first spacers 310 and 312 are formed on the fin structures 252 and 254, and the first isolation structures 270, 272, and 274, and are respectively located on two opposite sidewalls of the first dummy gate 290, such that the first dummy gate 290 are sandwiched between the first spacers 310 and 312. Two second spacers 320 and 322 are formed on the raised structure 260, and the second isolation structures 280 and 282, and are respectively located two opposite sidewalls of the second dummy gate 300, such that the second dummy gate 300 are sandwiched between the second spacers 320 and 322. The first spacers 310 and 312 and the second spacers 320 and 322 may be formed from silicon nitride or silicon oxynitride.

Figure 2H:
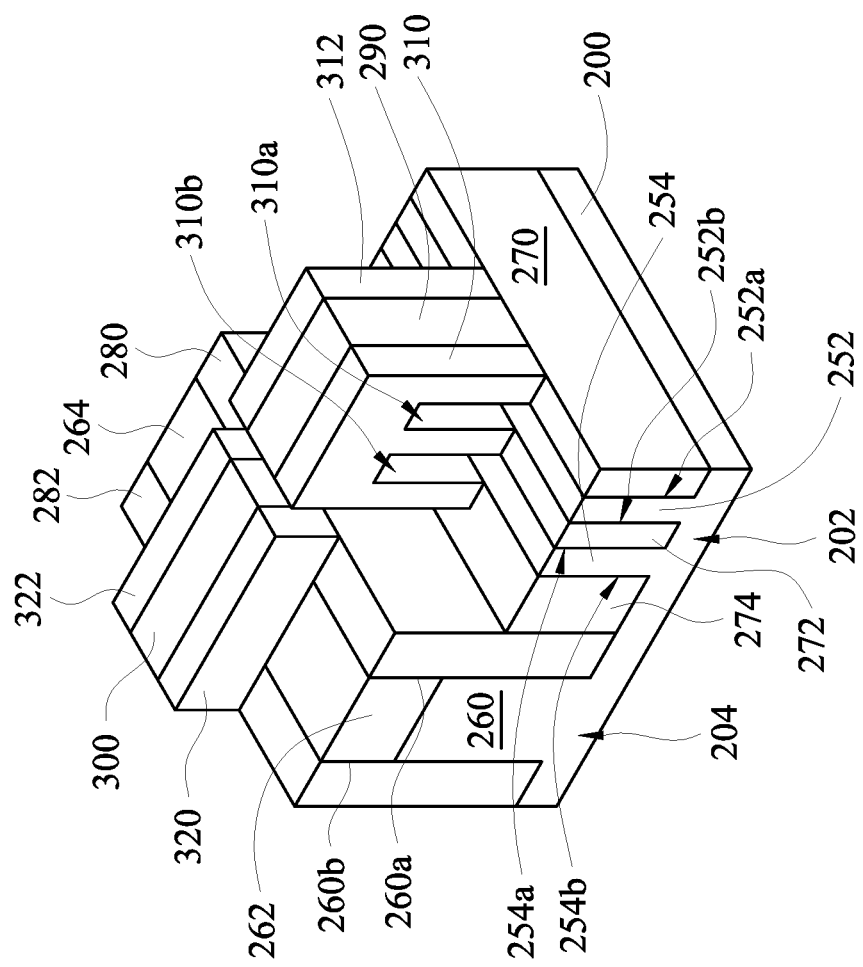

As shown in FIG. 2H, uncovered portions of the fin structures 252 and 254, and portions of the fin structure 252 and 254 covered by the first spacers 310 and 312 are removed, so as to form two holes 310a and 310b in the first spacer 310 and two holes (not shown in FIG. 2H) in the first spacer 312. The holes formed in the first spacer 312 are similar to the holes 310a and 310b formed in the first spacer 310. Referring to FIG. 2H again, in some examples, an implantation process may be performed on the second raised structure 260 to form two implantation regions 262 and 264 in the second raised structure 260 and adjacent to two sides of the second dummy gate 300.

Figure 2I:
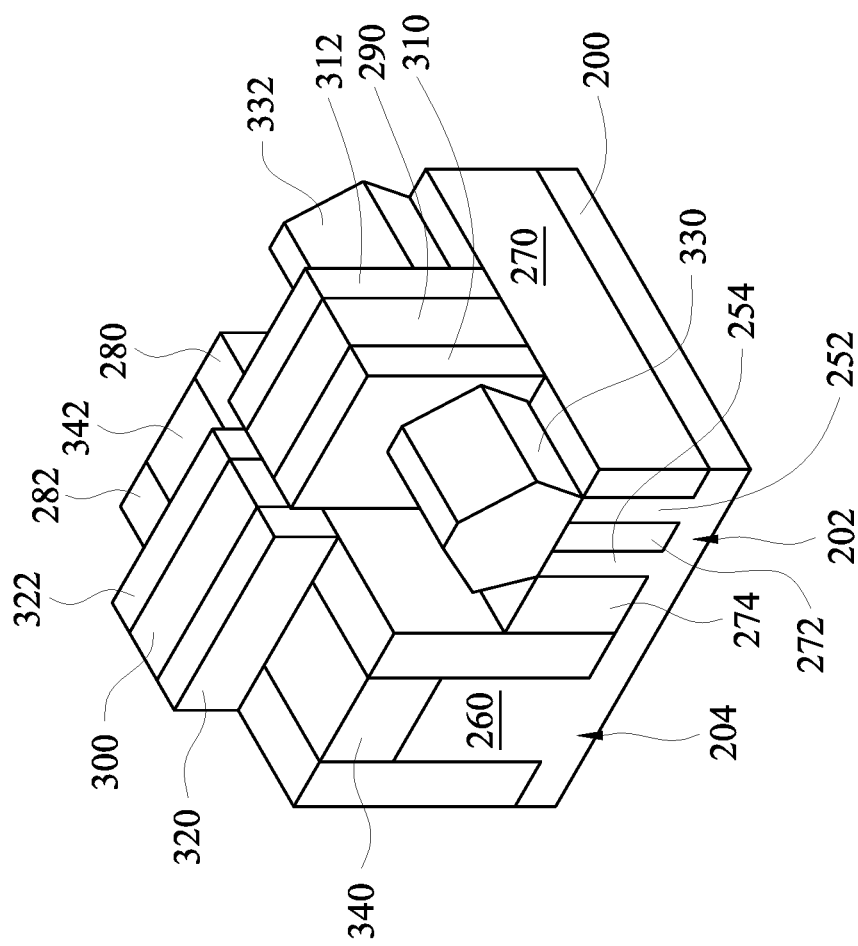

As shown in FIG. 2I, a first source 330, a first drain 332, a second source 340, and a second drain 342 are formed. The first source 330 and the first drain 332 are formed on the fin structures 252 and 254 and are respectively disposed on sidewalls of the first spacers 310 and 312 on two opposite sides of the first dummy gate 290. The first source 330 and the first drain 332 further respectively fill the holes 310a and 310b formed in the first spacer 310 and the holes formed in the first spacer 312. The second source 340 and the second drain 342 are formed in the implantation regions 262 and 264 in the second raised structure 260 and are respectively adjacent to the second spacers 320 and 322 on two opposite sides of the second dummy gate 300. In some exemplary examples, each of the first source 330, the first drain 332, the second source 340, and the second drain 342 is an epitaxy structure. For example, the first source 330, the first drain 332, the second source 340, and the second drain 342 are formed from epitaxial SiGe.

Figure 2J:
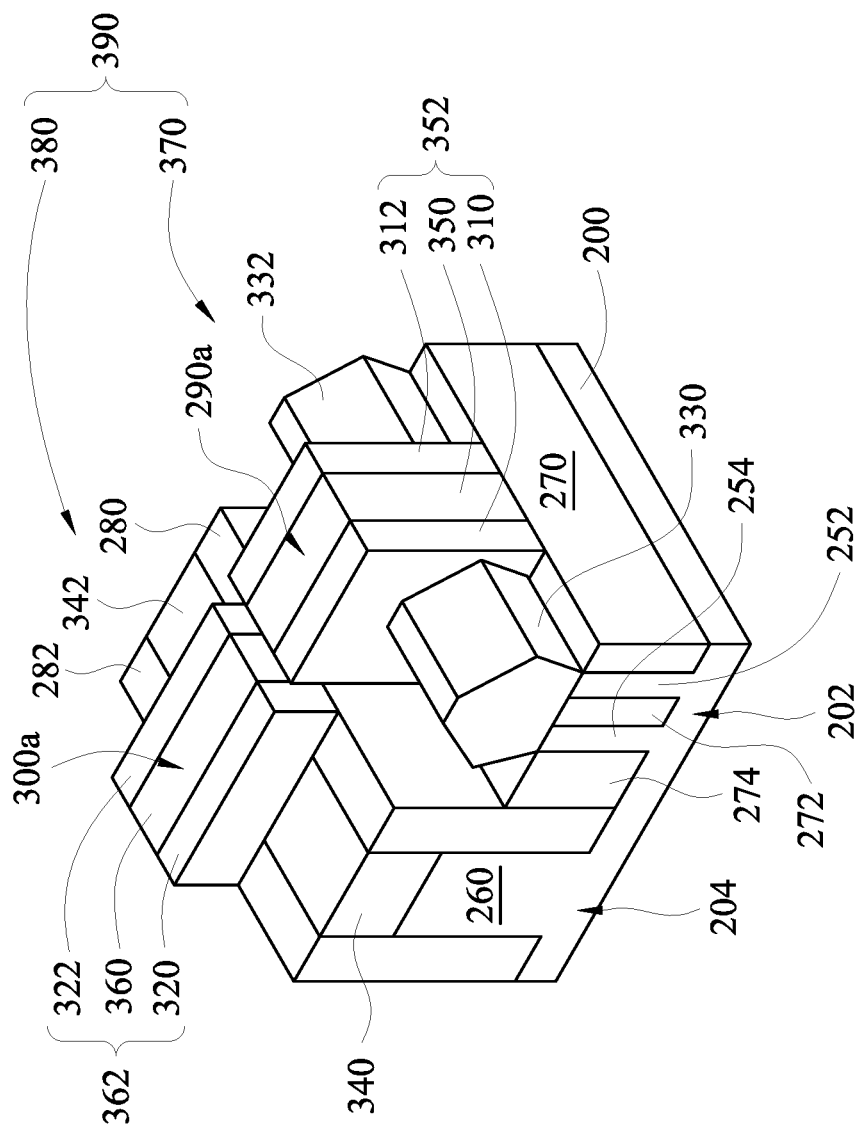

Referring to FIG. 2J, FIG. 2E, and FIG. 2F, the first dummy gate 290 is removed to form a first accommodating space 290a, and to expose the upper portions 252a" and 252b" of the sidewalls 252a and 252b and the top surface 252t of the first portion 252c of the fin structure 252 and the upper portions 254a" and 254b" of the sidewalls 254a and 254b and the top surface 254t of the first portion 254c of the fin structure 254. In addition, the second dummy gate 300 is removed to form a second accommodating space 300a, and to expose the top surface 260t of the first portion 260c of the second raised structure 260. Then, the first accommodating space 290a is filled with a first gate 350 to complete a first gate structure 352, so as to substantially complete a FinFET structure 370. The first gate structure 352 includes the first spacers 310 and 312 and the first gate 350. The first gate 350 includes a metal layer. The second accommodating space 300a is filled with a second gate 360 to complete a second gate structure 362, so as to substantially complete a planar FET structure 380. The second gate structure 362 includes the second spacers 320 and 322 and the second gate 360. The second gate 360 includes a metal layer. Thus, a semiconductor device 390 including the FinFET structure 370 and the planar FET structure 380 is substantially completed.

After the hard mask 210 used to define the first raised structure 250 of the FinFET structure 370 is completed, the mask layer 240 for defining the second raised structure 260 of the planar FET structure 380 is additionally formed on the second region 204 of the substrate 200, such that the FinFET structure 370 and the planar FET structure 380 can be simultaneously manufactured on the substrate 200. Thus, the process of manufacturing the semiconductor device 390 is simplified, and the semiconductor device 390 is microminiaturized.

Figure 3:
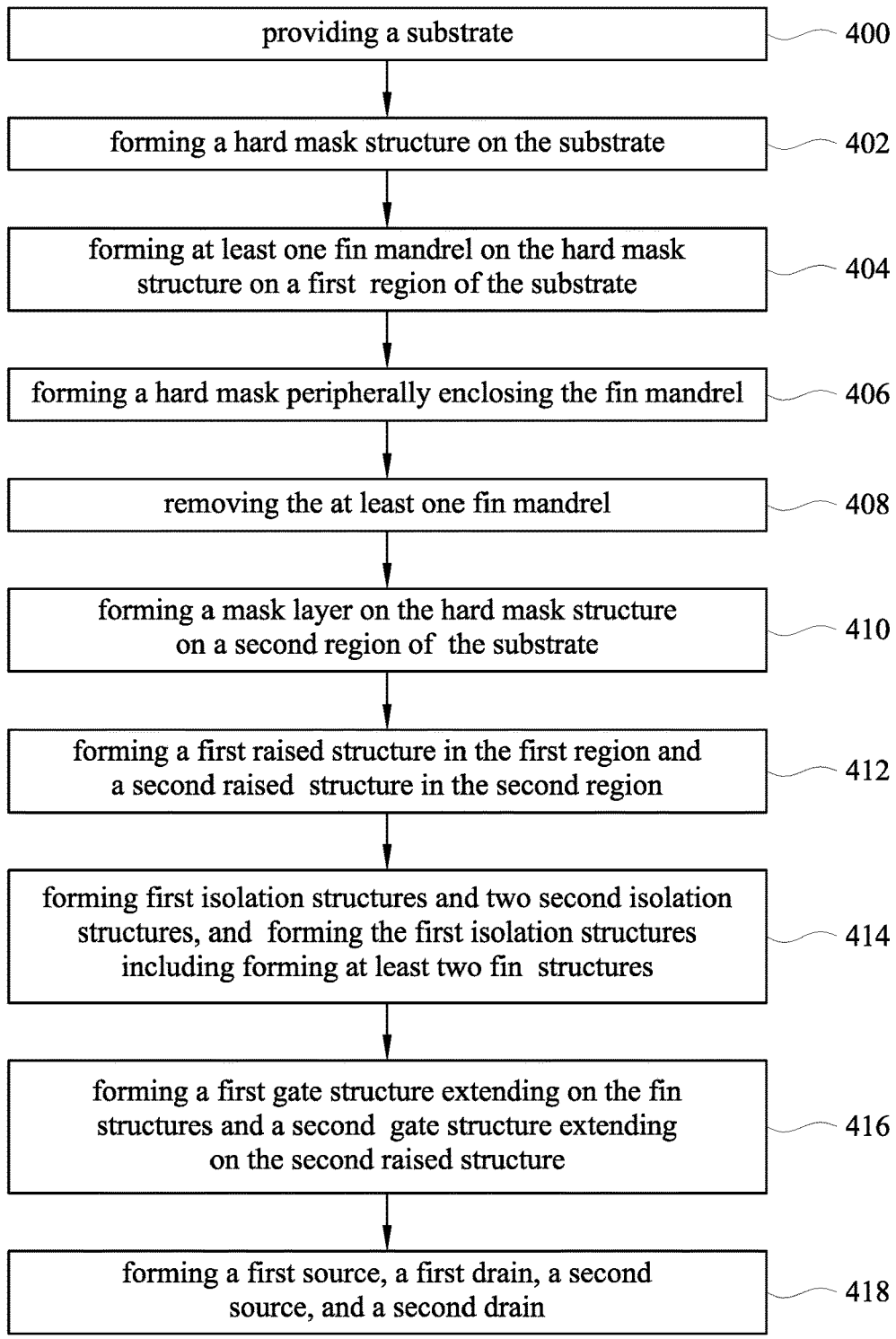
FIG. 3 is a flow chart of a method for manufacturing a semiconductor device in accordance with various embodiments.

Referring to FIG. 3 with FIG. 2A through FIG. 2J, FIG. 3 is a flow chart of a method for manufacturing a semiconductor device in accordance with various embodiments. The method begins at operation 400, where a substrate 200 is provided, as shown in FIG. 2A. The substrate 200 includes a first region 202 and a second region 204. The first region 202 may be adjacent to the second region 204. For example, silicon, germanium or glass may be used as a material of the substrate 200.

At operation 402, as shown in FIG. 2A, a hard mask structure 220 is formed on a surface 200a of the substrate 200. The hard mask structure 220 may be formed to include various layers. For example, in forming the hard mask structure 220, a pad oxide layer 222 is formed on the surface 200a of the substrate 200, a hard mask layer 224 is formed on the pad oxide layer 222, and an oxide layer 226 is formed on the hard mask layer 224. In some exemplary examples, the pad oxide layer 222 is formed by using a thermal oxidization technique or a deposition technique, such as a chemical vapor deposition (CVD) technique and physical vapor deposition (PVD) technique. The hard mask layer 224 and the oxide layer 226 may be formed by using a deposition technique, such as a chemical vapor deposition technique or a physical vapor deposition technique.

At operation 404, as shown in FIG. 2B, at least one fin mandrel 230 is formed on the hard mask structure 220 on the first region 202 of the substrate 200. In some exemplary examples, as shown in FIG. 2A, in forming the fin mandrel 230, a fin mandrel layer 232 is formed on the hard mask structure 220, an anti-reflective film 234 is formed on the fin mandrel layer 232, a protective layer 236 is formed on the anti-reflective film 234, and then an etching mask 238 is formed on a portion of the protective layer 236. For example, the fin mandrel layer 232, the anti-reflective film 234, and the protective layer 236 may be formed by using a deposition technique, such as a chemical vapor deposition technique or a physical vapor deposition technique. The etching mask 238 may be formed by performing a spin-coating process and a photolithography process. Then, an etching operation is performed on the protective layer 236, the anti-reflective film 234, and the fin mandrel layer 232 by using the etching mask 238 to block an etchant, such that a portion of the protective layer 236, a portion of the anti-reflective film 234, and a portion of the fin mandrel layer 232 are removed. After the etching operation is completed, the remaining protective layer 236 and the remaining anti-reflective film 234 are removed, and the remaining fin mandrel layer 232 is left to form the fin mandrel 230.

At operation 406, a hard mask 210 is formed to peripherally enclose the fin mandrel 230. The hard mask 210 may be formed by using a deposition technique, a photolithography technique, and an etching technique. In some exemplary examples, as shown in FIG. 2B and FIG. 2C, the fin mandrel 230 is a bar structure, and the hard mask 210 is a rectangular frame structure. The hard mask 210 has an etch selectivity related to the fin mandrel layer 232. For example, the hard mask 210 may be formed from silicon nitride, and the fin mandrel layer 232 may be formed from polysilicon. At operation 408, as shown in FIG. 2C, the fin mandrel 230 is removed by an etching process, such as a dry etching process, so as to leave the hard mask 210 on the first region 202 of the substrate 200.

At operation 410, referring to FIG. 2C again, a mask layer 240 is formed on the hard mask structure 220 on the second region 204 of the substrate 200. In some exemplary examples, the mask layer 240 is formed from photo-resist, and the mask layer 240 is formed by performing a spin-coating process and a photolithography process.

At operation 412, as shown in FIG. 2D, the substrate 200 is recessed to form a first raised structure 250 in the first region 202 and a second raised structure 260 in the second region 204. In some examples, the substrate 200 is recessed by performing an etching process with the hard mask 210 and the mask layer 240 as etching mask structures. The etching process is performed to remove portions of the hard mask structure 220 and portions of the substrate 200, which are not covered by the hard mask 210 and the mask layer 240. The etching process may be a dry etching process or a wet etching process. After the substrate 200 is recessed, the remaining hard mask 210 and the remaining mask layer 240 are removed.

At operation 414, at least two first isolation structures and two second isolation structures are formed. For example, as shown in FIG. 2E, three first isolation structures 270, 272, and 274, and two second isolation structures 280 and 282 are formed. In forming the first isolation structures, portions of the first raised structure 250, and portions of the hard mask structure 220 on the portions of the first raised structure 250 are removed to define the first raised structure 250 into at least two fin structures 252 and 254. The fin structures 252 and 254 are formed to extend along a direction 256. In some exemplary examples, the first isolation structures 270, 272, and 274 extend along the direction 256. Lower portions 252a' and 252b' of two opposite sidewalls 252a and 252b of the fin structure 252 are covered by the first isolation structures 270 and 272, and lower portions 254a' and 254b' of two opposite sidewalls 254a and 254b of the fin structure 254 are covered by the first isolation structures 272 and 274. In addition, a top surface 252t and upper portions 252a" and 252b" of the sidewalls 252a and 252b of the fin structure 252, and a top surface 254t and upper portions 254a" and 254b" of the sidewalls 254a and 254b of the fin structure 254 are exposed.

In some examples, the second isolation structures 280 and 282 extend along the direction 256. Two opposite sidewalls 260a and 260b of the second raised structure 260 are completely covered by the second isolation structures 280 and 282 respectively. In some exemplary examples, a top surface 260t of the second raised structure 260 is substantially aligned with a top surface 280t of the second isolation structure 280 and a top surface 282t of the second isolation structure 282. For example, the first isolation structures 270, 272, and 274, and the second isolation structures 280 and 282 are formed by using a high-density plasma chemical vapor deposition (HDP CVD) technique.

At operation 416, referring to FIG. 2J firstly, a first gate structure 352 is formed to extend on the fin structures 252 and 254, and a second gate structure 362 is formed to extend on the second raised structure 260. In some examples, as shown in FIG. 2F, in forming the first gate structure 352, a first dummy gate 290 is formed to extend on a first portion 252c of the fin structure 252, a first portion 254c of the fin structure 254, and portions of the first isolation structure 270, the first isolation structure 272, and the first isolation structure 274. The first dummy gate 290 is formed to have an extending direction which is different from the extending direction 256 of the fin structures 252 and 254. For example, the extending direction of the first dummy gate 290 may be perpendicular to the direction 256. The first dummy gate 290 is formed to cover the top surface 252t and the upper portions 252a" and 252b" of the sidewalls 252a and 252b of the first portion 252c of the fin structure 252, and the top surface 254t and the upper portions 254a" and 254b" of the sidewalls 254a and 254b of the first portion 254c of the fin structure 254. In forming the second gate structure 362, a second dummy gate 300 is formed to extend on a first portion 260c of the second raised structure 260, and portions of the second isolation structure 280 and the second isolation structure 282. In some exemplary examples, the first dummy gate 290 and the second dummy gate 300 are formed by using a deposition technique, a photolithography technique, and an etching technique.

As shown in FIG. 2G, in forming the first gate structure 352, after the first dummy gate 290 is formed, two first spacers 310 and 312 are formed on the fin structures 252 and 254, and the first isolation structures 270, 272, and 274, and are respectively located on two opposite sidewalls of the first dummy gate 290. In forming the second gate structure 352, after the second dummy gate 300 is formed, two second spacers 320 and 322 are formed on the raised structure 260, and the second isolation structures 280 and 282, and are respectively located two opposite sidewalls of the second dummy gate 300. The first spacers 310 and 312 and the second spacers 320 and 322 may be formed by using a deposition technique and an etching back technique.

In forming the first gate structure 352, referring to FIG. 2J, FIG. 2E, and FIG. 2F simultaneously, the first dummy gate 290 is removed to form a first accommodating space 290a, and to expose the upper portions 252a" and 252b" of the sidewalls 252a and 252b and the top surface 252t of the first portion 252c of the fin structure 252 and the upper portions 254a" and 254b" of the sidewalls 254a and 254b and the top surface 254t of the first portion 254c of the fin structure 254. In forming the second gate structure 362, the second dummy gate 300 is removed to form a second accommodating space 300a, and to expose the top surface 260t of the first portion 260c of the second raised structure 260. Then, the first accommodating space 290a is filled with a first gate 350 to complete a first gate structure 352, so as to substantially complete a FinFET structure 370. The second accommodating space 300a is filled with a second gate 360 to complete a second gate structure 362, so as to substantially complete a planar FET structure 380. The first gate structure 352 includes the first spacers 310 and 312 and the first gate 350, in which the first gate 350 includes a metal layer. The second gate structure 362 includes the second spacers 320 and 322 and the second gate 360, in which the second gate 360 includes a metal layer.

At operation 418, as shown in FIG. 2H, between forming the first spacers 310 and 312 and the second spacers 320 and 322, and filling the first accommodating space 290a and the second accommodating space 300a with the first gate 350 and the second gate 360, a first source 330, a first drain 332, a second source 340, and a second drain 342 are formed. In forming the first source 330 and the first drain 332, uncovered portions of the fin structures 252 and 254, and portions of the fin structure 252 and 254 covered by the first spacers 310 and 312 are removed by using an etching technique, so as to form two holes 310a and 310b in the first spacer 310 and two holes (not shown in FIG. 2H) in the first spacer 312. The first source 330 and the first drain 332 are formed on the fin structures 252 and 254 and are respectively disposed on sidewalls of the first spacers 310 and 312 on two opposite sides of the first dummy gate 290. The first source 330 and the first drain 332 further respectively fill the holes 310a and 310b formed in the first spacer 310 and the holes formed in the first spacer 312. For example, the first source 330 and the first drain 332 may be formed by using an epitaxy technique.

Referring to FIG. 2H again, in some examples, in forming the second source 340 and the second drain 342, an implantation process may be performed on the second raised structure 260 to form two implantation regions 262 and 264 in the second raised structure 260 and adjacent to two sides of the second dummy gate 300. The second source 340 and the second drain 342 are formed in the implantation regions 262 and 264 in the second raised structure 260 and are respectively adjacent to the second spacers 320 and 322 on two opposite sides of the second dummy gate 300. For example, the second source 340 and the second drain 342 may be formed by using an epitaxy technique. Thus, after the first accommodating space 290a and the second accommodating space 300a are respectively filled with the first gate 350 and the second gate 360, a semiconductor device 390 including the FinFET structure 370 and the planar FET structure 380 is substantially completed.

In accordance with an embodiment, the present disclosure discloses a method for manufacturing a semiconductor device. In this method, a substrate including a first region and a second region is provided. At least one hard mask is formed on the first region of the substrate. A mask layer is formed on the second region of the substrate. The substrate is recessed by using the at least one hard mask and the mask layer to form a fin structure in the first region and a raised structure in the second region. Two first isolation structures are formed to respectively cover lower portions of two opposite sidewalls of the fin structure, and two second isolation structures are formed to respectively cover two opposite sidewalls of the raised structure. A first gate structure is formed to extend on a first portion of the fin structure and portions of the first isolation structures, and a second gate structure is formed to extend on a first portion of the raised structure and portions of the second isolation structures, in which the first gate structure covers upper portions of the sidewalls and a top surface of the first portion of the fin structure. A first source and a first drain are respectively formed on two opposite sides of the first gate structure on the fin structure, and a second source and a second drain are respectively formed on two opposite sides of the second gate structure in the raised structure.

In accordance with another embodiment, the present disclosure discloses a method for manufacturing a semiconductor device. In this method, a substrate including a first region and a second region is provided. A hard mask is formed on the first region of the substrate. A mask layer is formed on the second region of the substrate. The substrate is recessed by using the hard mask and the mask layer to form a first raised structure in the first region and a second raised structure in the second region. Portions of the first raised structure are removed to form at least two fin structures which extend along a direction. First isolation structures and two second isolation structures are formed, in which lower portions of two opposite sidewalls of each of the fin structures are covered by two of the first isolation structures, and two opposite sidewalls of the second raised structure are completely covered by the second isolation structures. A first gate structure is formed to extend on first portions of the fin structures and portions of the first isolation structures, and a second gate structure is formed to extend on a first portion of the second raised structure and portions of the second isolation structures, in which the first gate structure covers upper portions of the sidewalls and top surfaces of the first portions of the fin structures. A first source and a first drain are respectively formed on two opposite sides of the first gate structure on the fin structures, and a second source and a second drain are respectively formed on two opposite sides of the second gate structure in the second raised structure.

In accordance with yet another embodiment, the present disclosure discloses a method for manufacturing a semiconductor device. In this method, a substrate including a first region and a second region is provided. The substrate is recessed by using a hard mask and a mask layer to form a fin structure in the first region and a raised structure in the second region. The hard mask is formed on the first region by using at least one fin mandrel. The mask layer is formed on the second region. Two first isolation structures are formed to respectively cover lower portions of two opposite sidewalls of the fin structure, and two second isolation structures are formed to respectively cover two opposite sidewalls of the raised structure. A first gate structure is formed to extend on a first portion of the fin structure and portions of the first isolation structures, and a second gate structure is formed to extend on a first portion of the raised structure and portions of the second isolation structures, in which the first gate structure covers upper portions of the sidewalls and a top surface of the first portion of the fin structure. A first source and a first drain are respectively formed on two opposite sides of the first gate structure on the fin structure, and a second source and a second drain are respectively formed on two opposite sides of the second gate structure in the raised structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   providing a substrate which comprises a first region and a second region;
   forming at least one hard mask that is a frame structure on the first region of the substrate;
   forming a mask layer on the second region of the substrate;
   recessing the substrate by using the at least one hard mask and the mask layer to form a first raised structure in the first region and a second raised structure in the second region;
   forming two first isolation structures and two second isolation structures respectively covering two opposite sidewalls of the second raised structure, wherein forming the two first isolation structures comprises removing portions of the first raised structure to form a fin structure, wherein lower portions of two opposite sidewalls of the fin structure are respectively covered by the two first isolation structures;
   forming a first gate structure extending on a first portion of the fin structure and portions of the two first isolation structures, and a second gate structure extending on a first portion of the second raised structure and portions of the two second isolation structures, wherein the first gate structure covers upper portions of the two opposite sidewalls and a top surface of the first portion of the fin structure; and
   forming a first source and a first drain respectively on two opposite sides of the first gate structure on the fin structure, and a second source and a second drain respectively on two opposite sides of the second gate structure on the second raised structure.

2. The method of claim 1, wherein a top surface of the second raised structure is substantially aligned with top surfaces of the two second isolation structures.

3. The method of claim 1, wherein after providing the substrate, the method further comprises:
   forming a pad oxide layer on a surface of the substrate;
   forming a hard mask layer on the pad oxide layer; and
   forming an oxide layer on the hard mask layer.

4. The method of claim 1, wherein forming the first gate structure comprises:
   forming a first dummy gate extending on the first portion of the fin structure and the portions of the two first isolation structures;
   forming two first spacers on two opposite sidewalls of the first dummy gate, the fin structure, and the two first isolation structures;
   removing the first dummy gate to form a first accommodating space and to expose the upper portions of the two opposite sidewalls and the top surface of the first portion of the fin structure; and filling the first accommodating space with a first gate.

5. The method of claim 4, wherein forming the first source and the first drain comprises:
   removing uncovered portions of the fin structure and portions of the fin structure covered by the two first spacers to form two holes respectively in the two first spacers; and
   forming the first source and the first drain respectively on sidewalls of the two first spacers and filling the two holes.

6. The method of claim 4, wherein forming the second gate structure comprises:
   forming a second dummy gate extending on the first portion of the second raised structure and the portions of the two second isolation structures;
   forming two second spacers on two opposite sidewalls of the second dummy gate, the second raised structure, and the two second isolation structures;
   removing the second dummy gate to form a second accommodating space and to expose a top surface of the first portion of the second raised structure; and
   filling the second accommodating space with a second gate.

7. The method of claim 6, wherein forming the second source and the second drain comprises:
   performing an implantation process on uncovered portions of the second raised structure to form two implantation regions in the second raised structure; and
   forming the second source and the second drain respectively in the two implantation regions.

8. A method for manufacturing a semiconductor device, the method comprising:
   providing a substrate comprising a first region and a second region;
   forming a hard mask on the first region of the substrate;
   forming a mask layer on the second region of the substrate;
   recessing the substrate by using the hard mask and the mask layer to form a first raised structure in the first region and a second raised structure in the second region;
   forming a plurality of first isolation structures and two second isolation structures, wherein forming the plurality of first isolation structures comprises removing portions of the first raised structure to form at least two fin structures which extend along a direction, wherein lower portions of two opposite sidewalls of each of the at least two fin structures are covered by two of the plurality of first isolation structures, and two opposite sidewalls of the second raised structure are completely covered by the two second isolation structures;
   forming a first gate structure extending on first portions of the at least two fin structures and portions of the plurality of first isolation structures, and a second gate structure extending on a first portion of the second raised structure and portions of the two second isolation structures, wherein the first gate structure covers upper portions of the two opposite sidewalls and top surfaces of the first portions of the at least two fin structures; and
   forming a first source and a first drain respectively on two opposite sides of the first gate structure on the at least two fin structures, and a second source and a second drain respectively on two opposite sides of the second gate structure in the second raised structure.

9. The method of claim 8, wherein a top surface of the second raised structure is substantially aligned with top surfaces of the two second isolation structures.

10. The method of claim 8, wherein after providing the substrate, the method further comprises forming a hard mask structure on a surface of the substrate.

11. The method of claim 10, wherein between forming the hard mask structure and forming the hard mask, the method further comprises forming at least one fin mandrel on the hard mask structure on the first region of the substrate, wherein the hard mask is formed to peripherally enclose the at least one fin mandrel.

12. The method of claim 11, wherein forming the at least one fin mandrel comprises:
   forming a fin mandrel layer on the hard mask structure;
   forming an anti-reflective film on the fin mandrel layer;
   forming a protective layer on the anti-reflective film;
   forming an etching mask on a portion of the protective layer; and
   performing an etching operation on the protective layer, the anti-reflective film, and the fin mandrel layer by using the etching mask.

13. The method of claim 12, wherein the fin mandrel layer has an etch selectivity related to the hard mask.

14. The method of claim 8, wherein forming the first gate structure comprises:
   forming a first dummy gate extending on the first portions of the at least two fin structures and the portions of the plurality of first isolation structures;
   forming two first spacers on two opposite sidewalls of the first dummy gate, the at least two fin structures, and the plurality of first isolation structures;
   removing the first dummy gate to form a first accommodating space and to expose the upper portions of the two opposite sidewalls and the top surfaces of the first portions of the at least two fin structures; and
   filling the first accommodating space with a first gate.

15. The method of claim 14, wherein forming the first source and the first drain comprises:
   removing uncovered portions of the at least two fin structures and portions of the at least two fin structures covered by the two first spacers to form holes respectively in the two first spacers; and
   forming the first source and the first drain respectively on sidewalls of the two first spacers and filling the holes.

16. The method of claim 14, wherein forming the second gate structure comprises:
   forming a second dummy gate extending on the first portion of the second raised structure and the portions of the two second isolation structures;
   forming two second spacers on two opposite sidewalls of the second dummy gate, the second raised structure, and the two second isolation structures;
   removing the second dummy gate to form a second accommodating space and to expose a top surface of the first portion of the second raised structure; and
   filling the second accommodating space with a second gate.

17. The method of claim 16, wherein forming the second source and the second drain comprises:
   removing uncovered portions of the second raised structure to form two recesses in the second raised structure; and
   forming the second source and the second drain respectively in the two recesses.

18. A method for manufacturing a semiconductor device, the method comprising:

providing a substrate comprising a first region and a second region;

recessing the substrate by using a hard mask and a mask layer to form a first raised structure in the first region and a second raised structure in the second region, wherein the hard mask is formed on the first region on a sidewall of at least one fin mandrel, and the mask layer is formed on the second region;

forming two first isolation structures and two second isolation structures respectively covering two opposite sidewalls of the second raised structure, wherein forming the two first isolation structures comprises removing portions of the first raised structure to form a fin structure, wherein lower portions of two opposite sidewalls of the fin structure are respectively covered by the two first isolation structures;

forming a first gate structure extending on a first portion of the fin structure and portions of the two first isolation structures, and a second gate structure extending on a first portion of the second raised structure and portions of the two second isolation structures, wherein the first gate structure covers upper portions of the two opposite sidewalls and a top surface of the first portion of the fin structure; and forming a first source and a first drain respectively on two opposite sides of the first gate structure on the fin structure, and a second source and a second drain respectively on two opposite sides of the second gate structure in the second raised structure.

19. The method of claim 18, wherein a top surface of the second raised structure is substantially aligned with top surfaces of the two second isolation structures.

20. The method of claim 18, wherein forming the at least one fin mandrel comprises:
forming a fin mandrel layer on the substrate;
forming an anti-reflective film on the fin mandrel layer;
forming a protective layer on the anti-reflective film;
forming an etching mask on a portion of the protective layer; and
performing an etching operation on the protective layer, the anti-reflective film, and the fin mandrel layer by using the etching mask.

* * * * *